United States Patent

[11] 3,621,299

[72] Inventor Ronald C. Barber Portland, Oreg.
[21] Appl. No. 859,844
[22] Filed Sept. 22, 1969
[45] Patented Nov. 16, 1971
[73] Assignee Tektronix Inc Beaverton, Oreg.

[54] MONOSTABLE MULTIVIBRATOR HAVING WIDE TIMING RANGE
10 Claims, 1 Drawing Fig.

[52] U.S. Cl. 307/273, 307/288, 328/207
[51] Int. Cl. H03k 3/284
[50] Field of Search 307/273, 288; 328/207; 331/113; 323/4

[56] References Cited

UNITED STATES PATENTS

| | | | |
|---|---|---|---|
| 2,929,958 | 3/1960 | Palmer | 328/207 X |
| 3,078,371 | 2/1963 | Mohring | 307/273 X |
| 3,315,099 | 4/1967 | Nishioka | 307/273 |
| 3,348,068 | 10/1967 | Miller | 307/288 X |
| 3,453,453 | 7/1969 | Hughes | 307/273 |
| 3,513,330 | 5/1970 | Berney | 307/273 X |

*Primary Examiner*—Donald D. Forrer
*Assistant Examiner*—R. C. Woodbridge
*Attorney*—Buckhorn, Blore, Klarquist and Sparkman

ABSTRACT: A monostable multivibrator is described in which a gate transistor is added to supply bias current to the base of an output transistor through a current path different from that through which the timing current flows. The gate transistor is of an opposite conductivity type than the output transistor and is switched off by such output transistor when the multivibrator is triggered. This monostable multivibrator has a much wider range of timing current adjustment which is greater than one thousand to one.

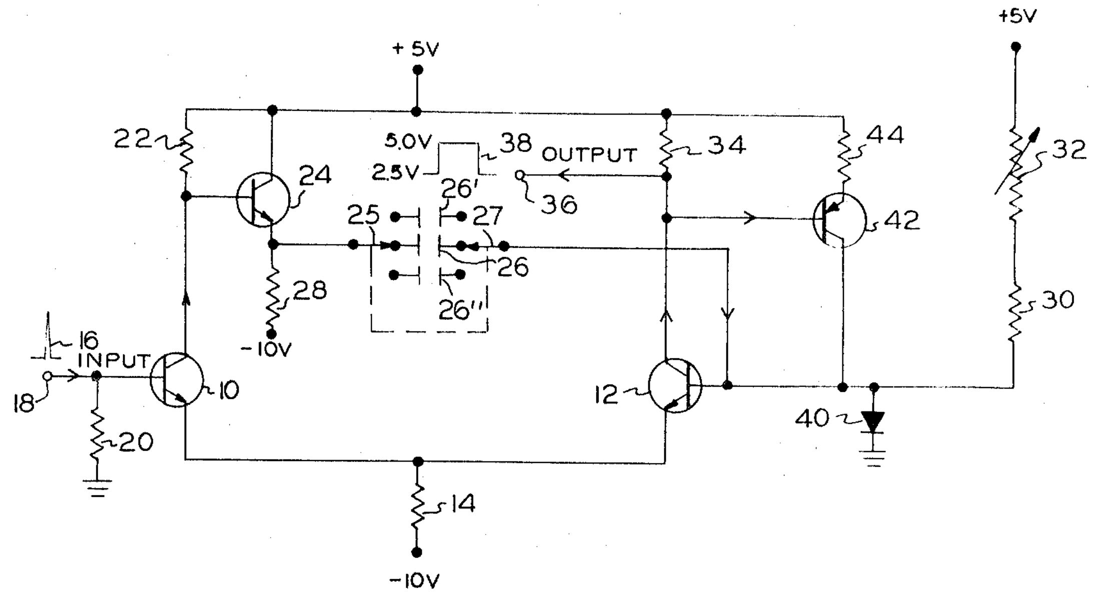
RONALD C. BARBER
*INVENTOR*
*BY*
*BUCKHORN, BLORE, KLARQUIST & SPARKMAN*
*ATTORNEYS*

MONOSTABLE MULTIVIBRATOR HAVING WIDE TIMING RANGE

BACKGROUND OF THE INVENTION

The subject matter of the present invention relates generally to triggered oscillators and, in particular, to a monostable multivibrator whose reversion time may be varied over a wide range. The monostable multivibrator of the present invention may be used in various types of electronic equipment, including time delay circuits and pulse generators which produce pulses of variable width.

The multivibrator of the present invention has an advantage over conventional monostable multivibrators in that it is capable of a much wider range of reversion time adjustment. In a conventional monostable multivibrator, this timing range is limited by the minimum amount of timing current which must be supplied to the output transistor to bias it in a normally conducting state. This problem is overcome in the present circuit by employing an additional source of bias current separate from the source of timing current. The bias current is supplied through a gate transistor which is switched on and off by the output transistor to which it supplies such bias current.

Previously, it has been suggested in U. S. Pat. No. 3,241,087 of Gossel, issued Mar. 15, 1966, to increase the frequency range of a monostable multivibrator by providing an additional current source transistor to supply a variable timing current to the bases of input and output transistors of such multivibrator. However, this circuit is much more complex than that of the present invention because the base bias current is supplied by the same source and is in the same current path as the timing current. As a result, the prior circuit requires the use of a pair of switching diodes to connect such current source transistor to the multivibrator transistors as well as a pair of Zener diodes connected across the two coupling capacitors. In contrast, the circuit of the present invention is much simpler and less expensive in that it employs only two additional elements over a conventional multivibrator, including the bias current supply gate transistor and an associated emitter bias resistor. This simplification results from the fact that the current supply gate transistor is provided in a separate current path from that through which the timing current flows and has its base connected to the output transistor of the multivibrator so that it is switched on and off by such output transistor.

It is therefore one object of the present invention to provide an improved monostable multivibrator having a wide timing range.

Another object of the invention is to provide such an improved monostable multivibrator in which a separate current source is employed to supply the quiescent base bias current for the output transistor through a current path other than that through which the timing current flows in order to reduce the minimum timing current possible.

A further object of the invention is to provide such a monostable multivibrator of simple and inexpensive construction which employs a minimum number of additional components by providing the output transistor bias current through a gate transistor which is switched on and off by such output transistor.

Other objects and advantages of the present invention will be apparent from the following detailed description of preferred embodiment thereof and from the attached drawings.

BRIEF DESCRIPTION OF THE DRAWINGS

The FIGURE of the drawing shows one embodiment of the monostable multivibrator of the present invention.

DESCRIPTION OF PREFERRED EMBODIMENT

As shown in the drawing, the monostable multivibrator of the present invention includes an input transistor 10 of NPN-type and an output transistor 12 of NPN-type having their emitters connected to a source of negative DC supply voltage of about −10 volts through a common emitter bias resistor 14 of about 1.3 kilohms. The base of the input transistor 10 is connected to a source of positive trigger pulses 16 at an input terminal 18. A base bias resistor 20 of about 510 ohms is connected between the base of transistor 10 and ground, and its collector is connected through a load resistor 22 of 510 ohms to a source of positive DC supply voltage of +5 volts.

An emitter follower transistor 24 of NPN-type is provided in the coupling path formed by a timing capacitor 26 selectively connected by switches 25 and 27 between the collector of the input transistor 10 and the base of the output transistor 12. The base of the emitter follower transistor 24 is connected to the collector of the input transistor 10, while its emitter is connected to one plate of capacitor 26 and to a source of negative DC supply voltage of about −10 volts through an emitter load resistor 28 of 1 kilohm, and its collector is connected to a source of positive DC supply voltage of +5 volts. The timing capacitor 26 is selected from a plurality of different value capacitors 26, 26', 26'' covering the range of about 50 picofarads to 50 microfarads and is connected at its other plate to the common terminal of the base of the output transistor 12 and a fixed timing resistor 30 of 5 kilohms. This resistor 30 is connected through a variable timing resistor 32 to a source of positive DC supply voltage of +5 volts to provide a variable source of DC timing current for charging capacitor 26. The value of resistor 32 is adjusted from 250 kilohms to 0 in order to vary the value of the timing current.

The collector of the output transistor 12 is connected through a load resistor 34 of 200 ohms to a source of positive DC supply voltage of +5 volts, and is also connected to an output terminal 36 for supplying a positive rectangular output pulse 38 of about 2.5 volts thereto when such transistor is switched off and on. A gating diode 40, barrier type, is connected at its anode to the common terminal of timing resistor 30 and the base of the output transistor 12. The cathode of the diode is grounded so that such diode is quiescently biased conducting by the +5-volts supply voltage on resistor 32. As a result, the timing current flowing through resistors 30 and 32 quiescently flows through the gating diode 40 to provide a positive bias voltage of about +0.7 volt on the base of the output transistor 12. Since this bias voltage makes the base of output transistor 12 more positive than the base of the input transistor 10, the output transistor is quiescently biased conducting while the input transistor is quiescently biased nonconducting.

A gating transistor 42 of PNP-type is connected at its emitter through an emitter bias resistor 44 of about 1 kilohm to a source of positive DC supply voltage of +5 volts and is connected at its collector to the base of output transistor 12 in order to supply sufficient base bias current for the output transistor to maintain such output transistor in its quiescently conducting state. Thus, the gating transistor 42, serving as the source of base bias current for the output transistor 12, is in a different current path from the path provided by the timing resistors 30 and 32 through which the timing current flows to the timing capacitor 26. The base of the gating transistor 42 is connected to the collector of the output transistor 12 so that such gating transistor is switched on and off by the output transistor. This considerably simplifies the gated bias current source.

The operation of the monostable multivibrator is as follows. When a positive trigger pulse is applied to input terminal 18, transistor 10 is rendered conducting and transmits a negative-going step signal from its collector to the base of the emitter follower transistor 24. This negative going step signal is transmitted from the emitter of transistor 24 as a negative voltage through the capacitor 26 to the base of output transistor 12 and the anode of diode 40, thereby rendering such output transistor and such diode nonconducting. When the output transistor 12 is switched off, the positive-going leading edge of the output pulse 38 is produced and the gating transistor 42 is also rendered nonconducting. This disconnects a source of base bias current from the base of the output transistor 12. At the same time, the switching off of diode 40 enables the timing current flowing through resistors 30 and 32 to be transmitted to the timing capacitor 26 to begin charging such capacitor toward the positive voltage on the upper terminal of resistor 32, such diode being held off by the negative voltage on the emitter of transistor 24.

When the voltage applied to the base of the output transistor 12 due to the charging of the timing capacitor 26 is sufficient to exceed that on the base of the input transistor 10, such output transistor switches back to its conducting state and such input transistor switches to its nonconducting state. This switching on of the output transistor 12 produces the negative-going trailing edge of the output pulse 38 and causes the gating transistor 42 to return to its conducting condition supplying bias current to hold such output transistor on. At the same time, the diode 40 is again switched into its conducting state so that the timing current flowing through resistors 30 and 32 then flows to ground through such diode. As a result, the timing capacitor 26 discharges to ground through such diode and the emitter follower 24 speeds the discharge of such capacitor.

The minimum timing current which can be set by adjusting the variable resistor 32 is much lower in the present circuit than in a conventional circuit because none of such timing current is used for the quiescent bias current applied to the base of the output transistor 12 to maintain it in a conducting state. Instead, all of this base bias current is supplied by the gating transistor 42. As a result, the range of timing current variation which may be achieved by adjustment of resistor 32 is much greater, such range being greater than 1,000 to 1. At the same time, the quiescent bias current flowing through the gating transistor 42 does not affect the timing current supplied to capacitor 26 because such gating transistor is rendered nonconducting when the output transistor 12 and diode 40 are switched off to cause the timing current to flow to such capacitor. As stated previously, the bias current supply circuit is considerably simplified by controlling the gating transistor 42 with the output signal of the output transistor 12. This also results in some savings in DC bias power dissipation since the gating transistor 42 is not always conducting.

It will be obvious to those having ordinary skill in the art that many changes may be made in the above-described details of the preferred embodiment of the present invention without departing from the spirit of the invention. For example, the transistors can be of the opposite type of conductivity from that shown. Furthermore, vacuum tubes or other types of signal-translating devices may be employed in place of the transistors shown. Therefore, the scope of the present invention should only be determined by the following claims.

I claim:

1. A monostable multivibrator circuit having a wide timing range, comprising:

a first signal-translating device having its control electrode connected to the trigger input terminal of said circuit;

a second signal-translating device having its output electrode connected to the output terminal of said circuit, and having its source electrode connected to the source electrode of said first device;

coupling means including a capacitor connected between the output electrode of said first device and the control electrode of said second device;

timing means including a variable source of DC timing current connected at a common terminal to the control electrode of said second device and to the capacitor through a first current path for changing the charging time of the capacitor by adjusting the magnitude of said timing current and a normally conducting first gate means connected between said common terminal and ground wherein said capacitor is charged only when said first gate means is rendered nonconductive; and bias means including a source of DC bias current connected to said second device through a second current path separate from said first path for supplying bias current to said second device to hold said second device in a conducting state, and a second gate means for switching said bias current off in response to the receipt of a trigger pulse at said input terminal to enable said second device to be rendered nonconducting.

2. A multivibrator circuit in accordance with claim 1 in which the second gate means is connected between the source of DC bias current and said common terminal at the control electrode of said second device, said second gate means having its control electrode connected to the output electrode of said second diode.

3. A multivibrator circuit in accordance with claim 2 in which the first gate means is a unilateral conducting device, and said second gate, unilateral device and second device have the same conduction states.

4. A multivibrator circuit in accordance with claim 1 which includes a third signal-translating device connected as a source follower amplifier having its control electrode connected to the output electrode of said first device, a load resistor connected to its output electrode and its output electrode connected to the timing capacitor.

5. A multivibrator circuit in accordance with claim 1 in which the timing means includes a variable resistor connected in series between the capacitor and a DC voltage source.

6. A multivibrator circuit in accordance with claim 1 in which the first and second devices are transistors having their emitters connected in common to an emitter bias resistance and having their collectors connected to a pair of output load resistances.

7. A multivibrator circuit in accordance with claim 2 in which the first and second devices are transistors of one type of conductivity and the second gate means is a transistor of the opposite type of conductivity having its base connected as the control electrode, its collector connected as the output electrode, and its emitter connected through a resistor to the source of DC bias current.

8. A multivibrator circuit in accordance with claim 3 in which the unilateral conducting device is a diode.

9. A multivibrator circuit in accordance with claim 4 in which the third device is a transistor having its base connected as the control electrode and its emitter connected as the output electrode to an emitter load resistor.

10. A multivibrator circuit in accordance with claim 3 in which the first device is a transistor quiescently biased nonconducting, the second device and the second gate means are transistors quiescently biased conducting, and the first gate means is a diode quiescently biased conducting.

PO-1050
(5/69)

UNITED STATES PATENT OFFICE
CERTIFICATE OF CORRECTION

Patent No. 3,621,299 Dated November 16, 1971

Inventor(s) Ronald C. Barber

It is certified that error appears in the above-identified patent and that said Letters Patent are hereby corrected as shown below:

In column 2, line 34, after "40," insert --which may be a metal to semiconductor diode of the Schottky--.

Signed and sealed this 12th day of December 1972.

(SEAL)
Attest:

EDWARD M.FLETCHER,JR.
Attesting Officer

ROBERT GOTTSCHALK
Commissioner of Patent